(12) United States Patent
Ikuta et al.

(10) Patent No.: US 10,756,172 B2
(45) Date of Patent: Aug. 25, 2020

(54) SEMICONDUCTOR DEVICE

(71) Applicant: Panasonic Intellectual Property Management Co., Ltd., Osaka (JP)

(72) Inventors: Teruhisa Ikuta, Toyama (JP); Hiroshi Sakurai, Toyama (JP); Satoru Kanai, Toyama (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 17 days.

(21) Appl. No.: 16/273,398

(22) Filed: Feb. 12, 2019

(65) Prior Publication Data

US 2019/0172908 A1   Jun. 6, 2019

Related U.S. Application Data

(63) Continuation of application No. PCT/JP2018/019926, filed on May 24, 2018.

(30) Foreign Application Priority Data

Jul. 14, 2017 (JP) .................................. 2017-138078

(51) Int. Cl.
   *H01L 29/06* (2006.01)
   *H01L 29/78* (2006.01)
   (Continued)

(52) U.S. Cl.
   CPC ...... *H01L 29/0653* (2013.01); *H01L 29/0696* (2013.01); *H01L 29/66681* (2013.01);
   (Continued)

(58) Field of Classification Search
   CPC ........... H01L 29/0653; H01L 29/78615; H01L 29/78624; H01L 29/7816; H01L 29/0696; H01L 29/66681; H01L 29/7835
   See application file for complete search history.

(56) References Cited

U.S. PATENT DOCUMENTS 7,719,086 B2 * 5/2010 Ikuta .................. H01L 29/1095
                                              257/517
7,990,232 B1 * 8/2011 Lee .................... H03H 9/02338
                                              333/186

(Continued)

FOREIGN PATENT DOCUMENTS

| JP | 2011-204924 | 10/2011 |
| JP | 5456147 B2 | 3/2014 |
| WO | 2012/107998 A1 | 8/2012 |

OTHER PUBLICATIONS

International Search Report issued in Application No. PCT/JP2018/019926 dated Jun. 26, 2018, with English translation.

*Primary Examiner* — Syed I Gheyas

(74) *Attorney, Agent, or Firm* — McDermott Will & Emery LLP

(57) ABSTRACT

A semiconductor device having a silicon-on-insulator (SOI) structure in which a source region and a drain region extend along a longitudinal direction that is a direction along a longer side of sides facing each other, and are disposed side-by-side in a lateral direction that is a direction perpendicular to the longitudinal direction. In a plan view, a body region extends along the longitudinal direction and is surrounded by a drift region and an insulating region. A space between the insulating region and the body region in the lateral direction becomes narrower from the center to the end of the body region in the longitudinal direction. This achieves high breakdown voltage in the semiconductor device.

13 Claims, 7 Drawing Sheets

(51) Int. Cl.
*H01L 29/66* (2006.01)
*H01L 29/786* (2006.01)

(52) U.S. Cl.
CPC ...... *H01L 29/7816* (2013.01); *H01L 29/7835* (2013.01); *H01L 29/78615* (2013.01); *H01L 29/78624* (2013.01)

(56) References Cited

U.S. PATENT DOCUMENTS

| | | | |
|---|---|---|---|
| 2004/0207492 A1* | 10/2004 | Nguyen | H03H 9/02338 333/199 |
| 2006/0118902 A1* | 6/2006 | Ikuta | H01L 29/66681 257/491 |
| 2011/0233668 A1 | 9/2011 | Obatake et al. | |
| 2012/0187485 A1* | 7/2012 | Morioka | H01L 29/7838 257/343 |
| 2017/0222042 A1* | 8/2017 | Lee | H01L 29/1083 |

* cited by examiner

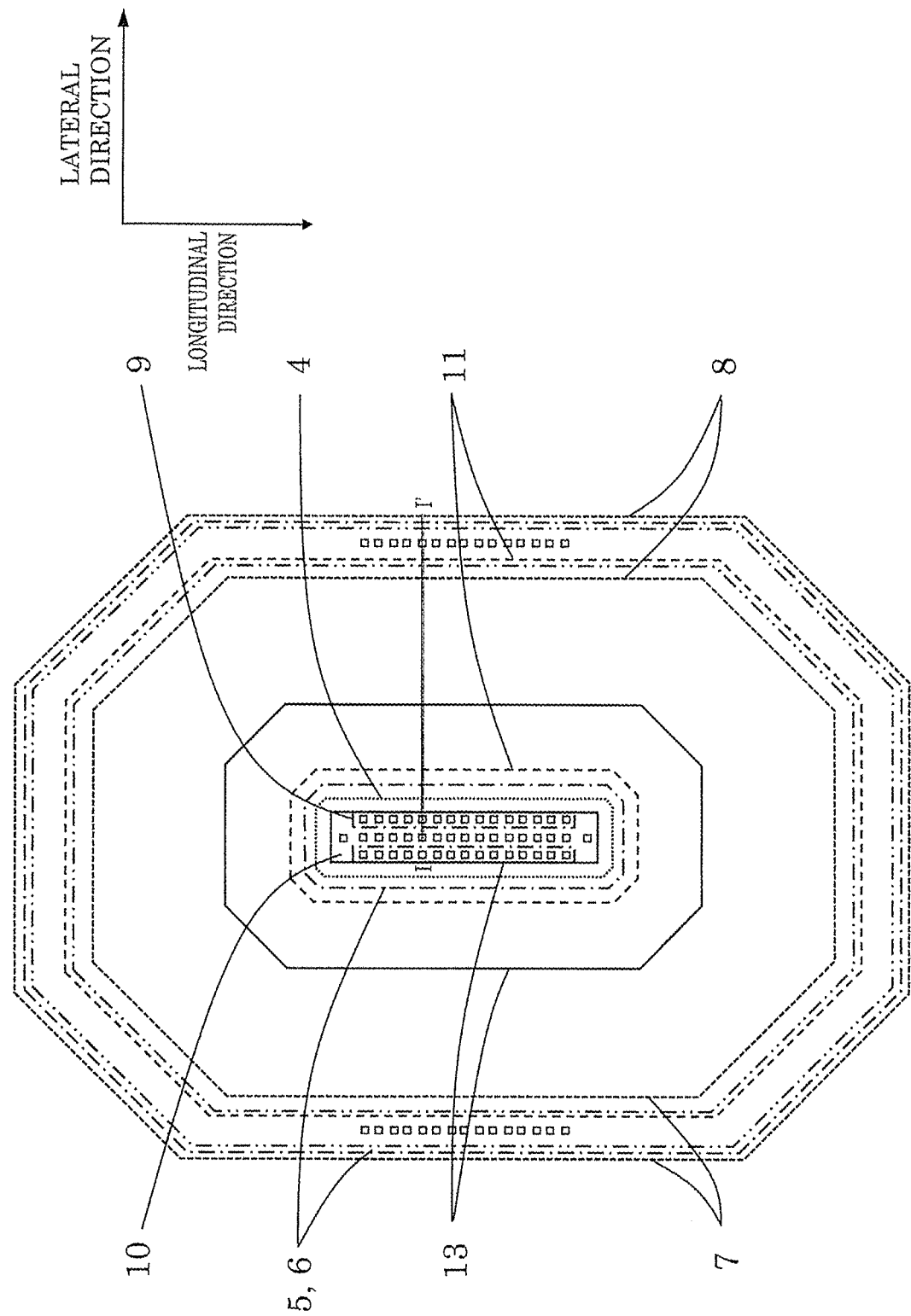

SEMICONDUCTOR DEVICE

CROSS REFERENCE TO RELATED APPLICATIONS

This application is a U.S. continuation application of PCT International Patent Application Number PCT/JP2018/019926 filed on May 24, 2018, claiming the benefit of priority of Japanese Patent Application Number 2017-138078 filed on Jul. 14, 2017, the entire contents of which are hereby incorporated by reference.

BACKGROUND

1. Technical Field

The present disclosure relates to a semiconductor device, and particularly relates to a lateral MOS transistor with high breakdown voltage.

2. Description of the Related Art

In order to increase the travel distance of an electric vehicle (EV) or a hybrid car and to prevent the overcharge of batteries, the development of a semiconductor integrated circuit (IC) intended for a battery management system (BMS) that measures and monitors the voltage of batteries has been in progress. In-vehicle battery used in an EV or hybrid car is formed by connecting lithium-ion batteries in series. Since a semiconductor IC intended for the BMS measures and monitors the voltage of the batteries connected in series, a metal oxide semiconductor (MOS) transistor with high breakdown voltage having a drain-source breakdown voltage of 100 V or higher is demanded.

In order to integrate such a MOS transistor having high breakdown voltage and gain high reliability even under high temperature environment, it is desirable to use a silicon-on-insulator (SOI) substrate. Deep trench isolation (DTI) is normally used for an SOI substrate to isolate devices. This is because, with PN junction isolation, leak current increases at high temperature, and in addition, the PN junction isolation region is easily affected by surge noise, and this activates parasitic transistors between devices and easily causes latchup. What is more, an area required for device isolation increases due to the expansion of an impurity diffusion region, and this causes difficulty.

There are two types of MOS transistors with high breakdown voltage: those each having a channel whose conductivity type is N-type; and those each having a channel whose conductivity type is P-type. Although a lateral P channel MOS transistor is raised as an example in the description, with the change of conductivity type of each of the elements in the transistor, the same can be achieved in the case of using a lateral N channel MOS transistor as with the lateral P channel MOS transistor.

When a source region and a body region are surrounded by a drain region in a planar layout of a lateral P channel MOS transistor with high breakdown voltage, breakdown voltage easily decreases due to yield at the edge of the body region in a plan view.

In view of this, Japanese Patent No. 5456147 (Patent Literature 1), WO No. 2012/107998 (Patent Literature 2), and Japanese Unexamined Patent Application Publication No. 2011-204924 (Patent Literature 3) each propose a semiconductor device with which it is possible to improve breakdown voltage.

SUMMARY

However, the solution disclosed in each of Patent Literatures 1 through 3 is not sufficient to meet the demand for improvement in breakdown voltage. For, the technology disclosed in each of the above-mentioned Patent Literatures 1 through 3 assumes the layout of an end portion of a device having breakdown voltage of approximately several dozen volts. In a device assumed to have a target breakdown voltage of 100 V or higher in the application of the present disclosure, an electric field toward a boundary between a gate insulating film and an STI region intensifies all the more as higher voltage is applied.

The present disclosure has been conceived in view of the above problems, and has an object to provide a semiconductor device having a MOS transistor structure with high breakdown voltage with which it is possible to improve breakdown voltage by alleviating electric field concentration at the end portions of the device in a plan view.

In order to overcome the above problem, the first semiconductor device according to the present disclosure includes; a semiconductor layer above a main face of a semiconductor substrate, with a buried insulating layer disposed between the semiconductor substrate and the semiconductor layer; a body region of a first conductivity type in an upper portion of the semiconductor layer; a drain region of a second conductivity type in the upper portion of the semiconductor layer and spaced apart from the body region; a source region of the second conductivity type in a surface of the body region; a drift region of the second conductivity type between the drain region and the body region in the semiconductor layer; an insulating region between the body region and the drain region in a surface of the semiconductor layer, the insulating region overlapping with the drift region; a gate insulating film extending over a portion of the body region up to an edge of the insulating region in a surface of the semiconductor layer; a gate electrode extending over a portion of the gate insulating film and a portion of the insulating region; and an electrode on the source region and an electrode on the drain region. In a plan view: the source region and the drain region extend along a longitudinal direction and are disposed side-by-side in a lateral direction, the longitudinal direction being a direction along a longer side of sides facing each other, the lateral direction being a direction perpendicular to the longitudinal direction; and the body region extends along the longitudinal direction and is surrounded by the drift region and the insulating region. A space in the lateral direction between the insulating region and the body region becomes narrower from a center to an end of the body region in the longitudinal direction.

In the first semiconductor device of the present disclosure, in the plan view, the space in the lateral direction between the insulating region and the body region may become narrower from the center to the end of the body region in the longitudinal direction such that the insulating region and the body region come into contact at the end.

In the first semiconductor device of the present disclosure, in the plan view, from the center to the end of the body region in the longitudinal direction, the space in the lateral direction between the insulating region and the body region may become narrower by a width becoming narrower, the width being a width of an uncovered region of the insulating region.

The second semiconductor device according to the present disclosure includes: a semiconductor layer above a main face of a semiconductor substrate, with a buried insulating layer disposed between the semiconductor substrate and the semiconductor layer; a body region of a first conductivity type in an upper portion of the semiconductor layer; a drain region of a second conductivity type in the upper portion of the semiconductor layer and spaced apart from the body region; a source region of the second conductivity type in a surface of the body region; a drift region of the second conductivity type between the drain region and the body region in the semiconductor layer; an insulating region between the body region and the drain region in a surface of the semiconductor layer; a gate insulating film extending over a portion of the body region up to an edge of the insulating region in a surface of the semiconductor layer; a gate electrode extending over a portion of the gate insulating film and a portion of the insulating region; and an electrode on the source region and an electrode on the drain region. In a plan view: the source region and the drain region extend along a longitudinal direction and are disposed side-by-side in a lateral direction, the longitudinal direction being a direction along a longer side of sides facing each other, the lateral direction being a direction perpendicular to the longitudinal direction; and the body region and the insulating region extend along the longitudinal direction and are disposed such that one of the body region and the insulating region surrounds the other of the body region and the insulating region in a layout, the layout including a first edge line which indicates an edge of the insulating region and a second edge line which indicates an edge of the body region, the first edge line and the second edge line passing beneath the gate electrode. The second edge line forms a boundary between the body region and the semiconductor layer which have impurity concentrations or conductivity types different from each other. In the plan view: the first edge line and the second edge line each have: straight portions that face each other and extend along the longitudinal direction; and curved portions each connecting ends of the straight portions either by a polygonal line forming an obtuse vertex angle or a curved line including an arc; in the straight portions, the second edge line indicating the body region includes a portion located nearer, in the lateral direction, to the source region than the first edge line indicating the insulating region; in the curved portions, the first edge line indicating the insulating region includes a portion located nearer, in the longitudinal direction, to the source region than the second edge line indicating the body region; the first edge line intersects with the second edge line at an intersection; and at the intersection, an angle made by the first edge line and the second edge line is acute, the first edge line and the second edge line forming a space that becomes narrower in the longitudinal direction.

The third semiconductor device according to the present disclosure includes: a semiconductor layer of a first conductivity type above a main face of a semiconductor substrate, with a buried insulating layer disposed between the semiconductor substrate and the semiconductor layer; a body region of the first conductivity type in an upper portion of the semiconductor layer; a drain region of a second conductivity type in the upper portion of the semiconductor layer and spaced apart from the body region; a source region of the second conductivity type in a surface of the body region; a drift region of the second conductivity type between the drain region and the body region in the semiconductor layer; an insulating region between the body region and the drain region in a surface of the semiconductor layer; a gate insulating film extending over a portion of the body region up to an edge of the insulating region in a surface of the semiconductor layer; a gate electrode extending over a portion of the gate insulating film and a portion of the insulating region; and an electrode on the source region and an electrode on the drain region. In a plan view: the source region and the drain region extend along a longitudinal direction and are disposed side-by-side in a lateral direction, the longitudinal direction being a direction along a longer side of sides facing each other, the lateral direction being a direction perpendicular to the longitudinal direction; and the drift region and the insulating region extend along the longitudinal direction and are disposed such that one of the drift region and the insulating region surrounds the other of the drift region and the insulating region in a layout, the layout including a first edge line indicating an edge of the insulating region and a third edge line indicating an edge of the drift region, the first edge line and the third edge line passing beneath the gate electrode. The third edge line forms a boundary between the drift region and the semiconductor layer which have conductivity types different from each other. In the plan view: the first edge line and the third edge line each have: straight portions that face each other and extend along the longitudinal direction; and curved portions each connecting ends of the straight portions either by a polygonal line forming an obtuse vertex angle or a curved line including an arc; in the straight portions, the third edge line indicating the drift region includes a portion located nearer, in the lateral direction, to the source region than the first edge line indicating the insulating region; in the curved portions, the first edge line indicating the insulating region includes a portion located nearer, in the longitudinal direction, to the source region than the third edge line indicating the drift region; the first edge line intersects with the third edge line at an intersection; and at the intersection, an angle made by the first edge line and the third edge line is acute, the first edge line and the third edge line forming a space that becomes narrower in the longitudinal direction.

In the second semiconductor device according to the present disclosure, in the plan view, the angle that is acute at the intersection may be in a range from 30 degrees to GO degrees, inclusive.

In the second semiconductor device according to the present disclosure, in the plan view, in a region in which the body region overlaps with the gate electrode, a space in the longitudinal direction at the curved portions of the second edge line indicating the body region may be wider than a space in the lateral direction at the straight portions of the second edge line indicating the body region.

In the second semiconductor device according to the present disclosure, in the plan view, a space, on the gate insulating film, from an edge of the gate electrode to an edge of the insulating region may be narrower in the longitudinal direction at the curved portions of the first edge line indicating the insulating region than in the lateral direction at the straight portions of the first edge line indicating the insulating region.

In the second semiconductor device according to the present disclosure, in the plan view: a first end position may be located nearer to the source region than a second end position, the first end position being a position located at one end point, on a side of one end portion of one straight portion, of one of the first edge line and the second edge line, the second end position being a position located at one end point, on a side of one end portion of one straight portion, of the other of the first edge line and the second edge line; and the one of the first edge line and the second edge line may be located farther from the source region than the other of the first edge line and the second edge line.

In the second semiconductor device according to the present disclosure, in the plan view, the first end position may be located nearer to the source region than the second end position by at least half a size difference between two widths: a width between the straight portions of the second edge line indicating the body region; and a width between the straight portions of the first edge line indicating the insulating region.

In the second semiconductor device according to the present disclosure, in the plan view, a space between the first edge line indicating the insulating region and the second edge line indicating the body region or the third edge line indicating the drift region may be narrower in the longitudinal direction at the curved portions than in the lateral direction at the straight portions.

In the first semiconductor device according to the present disclosure, in the plan view, a span of the gate electrode having a ring shape may be narrower in the longitudinal direction than in the lateral direction.

In the first semiconductor device according to the present disclosure, in the plan view, a space of a region, which uncovers the body region, of the gate electrode may be narrower in the longitudinal direction at the curved portions of the second edge line indicating the body region than in the lateral direction at the straight portions of the second edge line indicating the body region.

With the semiconductor device according to the present invention, it is possible to provide a MOS transistor having high breakdown voltage that is highly effective for achieving high breakdown voltage demanded for use in in-vehicle devices.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

(A) in FIG. 1 is a plan view schematically illustrating a configuration of a semiconductor device according to Embodiment 1, and (B) in FIG. 1 is a schematic plan view in which a relevant part in (A) in FIG. 1 is enlarged.

Figure 5:
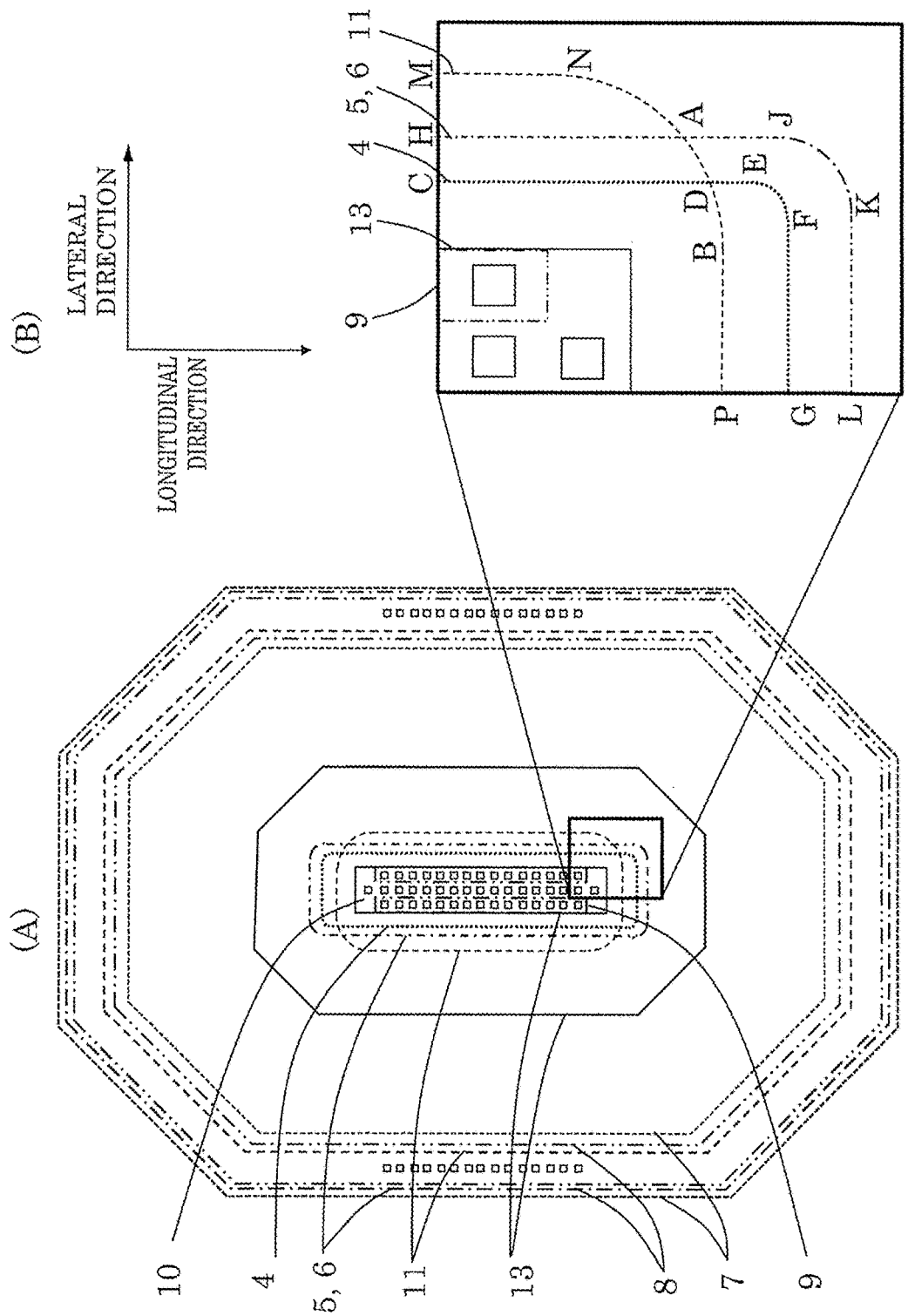
Figure 6:
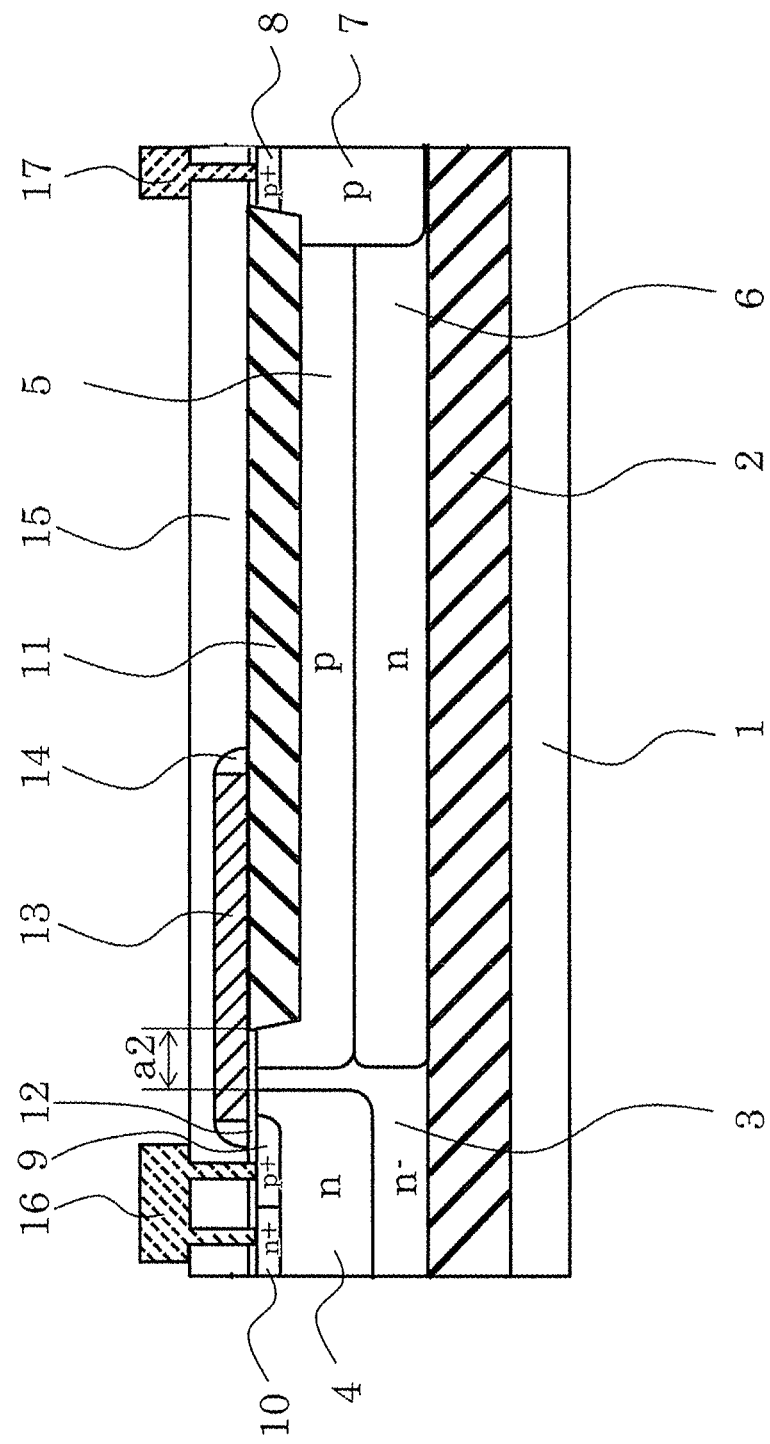

(A) in FIG. 5 is a plan view schematically illustrating a configuration of a semiconductor device according to Embodiment 2, and (B) in FIG. 5 is a schematic plan view in which a relevant part in (A) in FIG. 5 is enlarged;

FIG. 6 is a cross-sectional view schematically illustrating a configuration of a lateral P channel MOS transistor illustrated as a comparative example, and is a schematic cross-sectional view taken along the line I-I' in FIG. 7; and FIG. 7 is a plan view schematically illustrating a configuration of the lateral P channel MOS transistor illustrated as a comparative example.

DETAILED DESCRIPTION OF THE EMBODIMENTS (Underlying Knowledge Forming Basis of the Present Disclosure)

The inventors of the present disclosure have discovered the following problems related to the semiconductor device mentioned in the section of "BACKGROUND".

FIG. 6 is a cross-sectional view of a lateral P channel MOS transistor illustrated as a comparative example.

As illustrated in FIG. 6, an SOI substrate, which is formed on supporting substrate 1 by bonding buried insulating layer 2 to low-concentration $n^-$ type semiconductor layer 3, is used in the lateral P channel MOS transistor illustrated as a comparative example. N-type body region 4, p-type drift region 5, n-type buried region 6, and p type drain region 7 are formed on low-concentration $n^-$ type semiconductor layer 3 in the SOI substrate. High-concentration $p^+$ type drain region 8 is formed in the surface of p type drain region 7. Furthermore, high-concentration $p^+$ type source region 9 and high-concentration $n^+$ type body contact region 10 are formed in the upper portion of n-type body region 4.

Shallow trench isolation (STI) region 11, which is one portion of the surface of low-concentration $n^-$ type semiconductor layer 3 and consists of a relatively thick insulating film, is formed between high-concentration $p^+$ type drain region 8 and n-type body region 4. Relatively thin gate insulating film 12, which is another portion of the surface of low-concentration $n^-$ type semiconductor layer 3, extends over n-type body region 4 and a portion of p-type drift region 5.

Gate electrode 13 extends over a portion of gate insulating film 12 and a portion of STI region 11. Side wall spacers 14 are formed on the side walls of gate electrode 13, and interlayer insulating film 15 is formed to cover gate electrode 13. On high-concentration $p^+$ type source region 9 and high-concentration $n^+$ type body contact region 10, source electrode 16 which penetrates interlayer insulating film 15 to be electrically connected with these regions is formed. On high-concentration $p^+$ type drain region 8, drain electrode 17 which penetrates interlayer insulating film 15 to be electrically connected with high-concentration $p^+$ type drain region 8 is formed.

FIG. 7 illustrates a plan view of the lateral P channel MOS transistor illustrated as a comparative example, and FIG. 6 that has previously been described illustrates a cross-sectional view of the lateral P channel MOS transistor taken along the line I-I' in FIG. 7.

As illustrated in FIG. 7, n-type body region 4 has a rectangular shape extending in the longitudinal direction of the transistor, and the four corners are chamfered. High-concentration $p^+$ type source region 9 and high-concentration $n^+$ type body contact region 10 are disposed adjacent to each other inside n-type body region 4. STI region 11 is disposed spaced apart from n-type body region 4 and forming a ring shape to surround n-type body region 4. Furthermore, p type drain region 7 and high-concentration $p^+$ type drain region 8 are disposed forming a ring shape outside STI region 11 to surround n-type body region 4.

$P^+$ type source region 9 and $p^+$ type drain region 8 are disposed side-by-side in the lateral direction of the transistor, spaced apart from each other, and extend along a longitudinal direction, which is a direction longer between the two pairs of sides facing each other.

Gate insulating film 12 is formed in an inner region surrounded by STI region 11 having a ring shape, and gate electrode 13 extends from an edge, on gate insulating film 12 and high-concentration p+ type source region 9, of high-concentration n+ type body contact region 10 having a rectangular shape and extends over a portion of STI region 11. Here, high-concentration V type source region 9, n-type body region 4, p-type drift region 5, p type drain region 7, and high-concentration p+ type drain region 8 are linearly disposed side-by-side in this order in a lateral direction that is perpendicular to the longitudinal direction, and a drain current mostly flows in this direction when the transistor is in operation.

In a plan view, each of the regions described above is enclosed by a line (hereinafter referred to as edge line) indicating its edge. In FIG. 7, n-type body region 4, high-concentration p+ type source region 9, and high-concentration n+ type body contact region 10 are each indicated by a single edge line indicating its outer periphery, and p-type drift region 5, n-type buried region 6, p-type drain region 7, high-concentration p+ type drain region 8, STI region 11, and gate electrode 13 are each indicated by a double line indicating its inner and outer peripheries. No region is present inside the inner periphery of each region and the portion indicated by the double line forms a ring shape.

Here, an edge line indicating the outer periphery of n-type body region 4, an edge line indicating the inner periphery of p-type drift region 5, and an edge line indicating the inner periphery of STI region 11 are positioned in this order outwardly from inside in every direction in a plan view regardless of longitudinal or lateral, and do not intersect with one another.

With the use of a layout in which the body region is surrounded by the drain region, for the high breakdown-voltage MOS transistor illustrated as a comparative example, it is possible to lower the current density on the drain side when drain current flows in the on-state, and this can increase the drain-source breakdown voltage in the on-state.

In contrast, the problem is that it is difficult to improve the drain-source breakdown voltage in the off-state.

It is conceivable that this is because the curvature of equipotential lines increases due to a depletion layer expanding near the end portions of the body region in the plan view, which causes a rise of the electric field. Furthermore, in the case of using, for a field oxide film, an STI structure used for device isolation, the electric field easily concentrates at the edge of the STI region that is in contact with the gate insulating film. Therefore, avalanche easily occurs and causes reduction of breakdown voltage in a portion where the curvature increases in the end portions of the STI region in the plan view. The portion where the curvature increases in the end portions of the STI region is located near the end portion of a device region including the source, gate, and drain regions that are disposed side-by-side and involve transistor operation.

In view of this, the size of a region in which a gate insulating film overlaps with a drift region is made shorter in the end portions of a device than any portion other than the end portions, which is disclosed in Patent Literature 1 as a plane layout method for alleviating such electric field near the end portions. It should be noted that, according to Patent Literature 1, regarding the overlapping region between the gate insulating film and the drift region, the end portions of the device and the portions other than the end portions are at right angles in a plan view.

Another method, as disclosed in Patent Literature 2, is to cause the end of a drift region on a body region side to recede in the direction toward a drain region up to an STI region, in the portion, which forms an arc and at which the curvature increases, in the end portion of the body region. This aims to: remove the drift region having a relatively high concentration from an STI region edge which is in contact with the gate insulating film and in which the electric field concentrates; to promote lateral expansion of a depletion layer by locating the STI region edge on a low-concentration semiconductor layer of the conductivity type identical to that of the drift region; and to improve breakdown voltage by reducing the magnitude of electric field at the STI region edge.

The technology disclosed in each of above-mentioned Patent Literatures 1 and 2, however, assumes the layout of the end portions of a device having breakdown voltage of approximately several dozen volts. In a device having a target breakdown voltage of 100 V or higher in the application of the present disclosure, an electric field intensifies toward a boundary between a gate insulating film and an STI region all the more as higher voltage is applied. Therefore, the solution disclosed in each of Patent Literatures 1 and 2 is not sufficient to meet the demand for improvement in breakdown voltage.

The present disclosure has been conceived in view of the above-described problems, and has an object to provide a semiconductor device having a high breakdown-voltage MOS transistor structure with which it is possible to achieve high breakdown voltage by alleviating electric field concentration at the end portions of the device in a plan view.

The following describes the embodiments for implementing the present invention with reference to the drawings. Note however that in order to avoid unnecessarily redundant description so that those skilled in the art easily understand the present invention, detailed description of well-known matters and duplicate description of substantially like elements may be omitted in some cases.

Note that the attached drawings and the following description are mere examples for those skilled in the art to fully understand the present disclosure and do not intend to limit the subject matters recited in the claims of the present disclosure.

Moreover, in each of the regions which will be described in the following embodiments, a line indicating the edge of a region is referred to as an edge line. More specifically, an edge line that connects the outer edge of a region is referred to as an outer edge line while an edge line that connects the inner edge of a region is referred to as an inner edge line.

Embodiment 1

Figure 1:
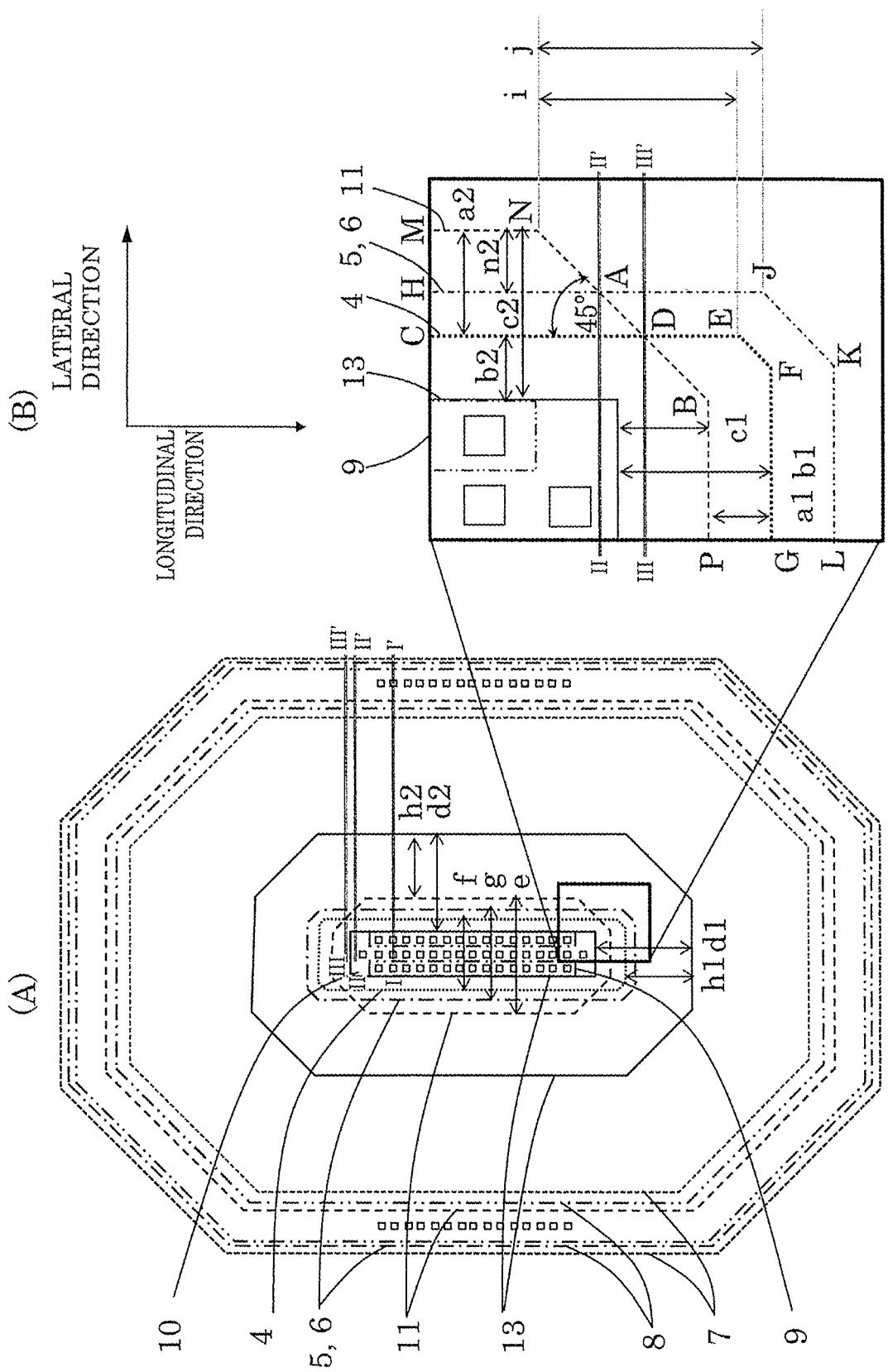

(A) in FIG. 1 illustrates a plan view of a lateral P channel MOS transistor as an example of the semiconductor device according to Embodiment 1, and (B) in FIG. 1 illustrates an enlarged view of a relevant part of the lateral P channel MOS transistor.

Figure 2:
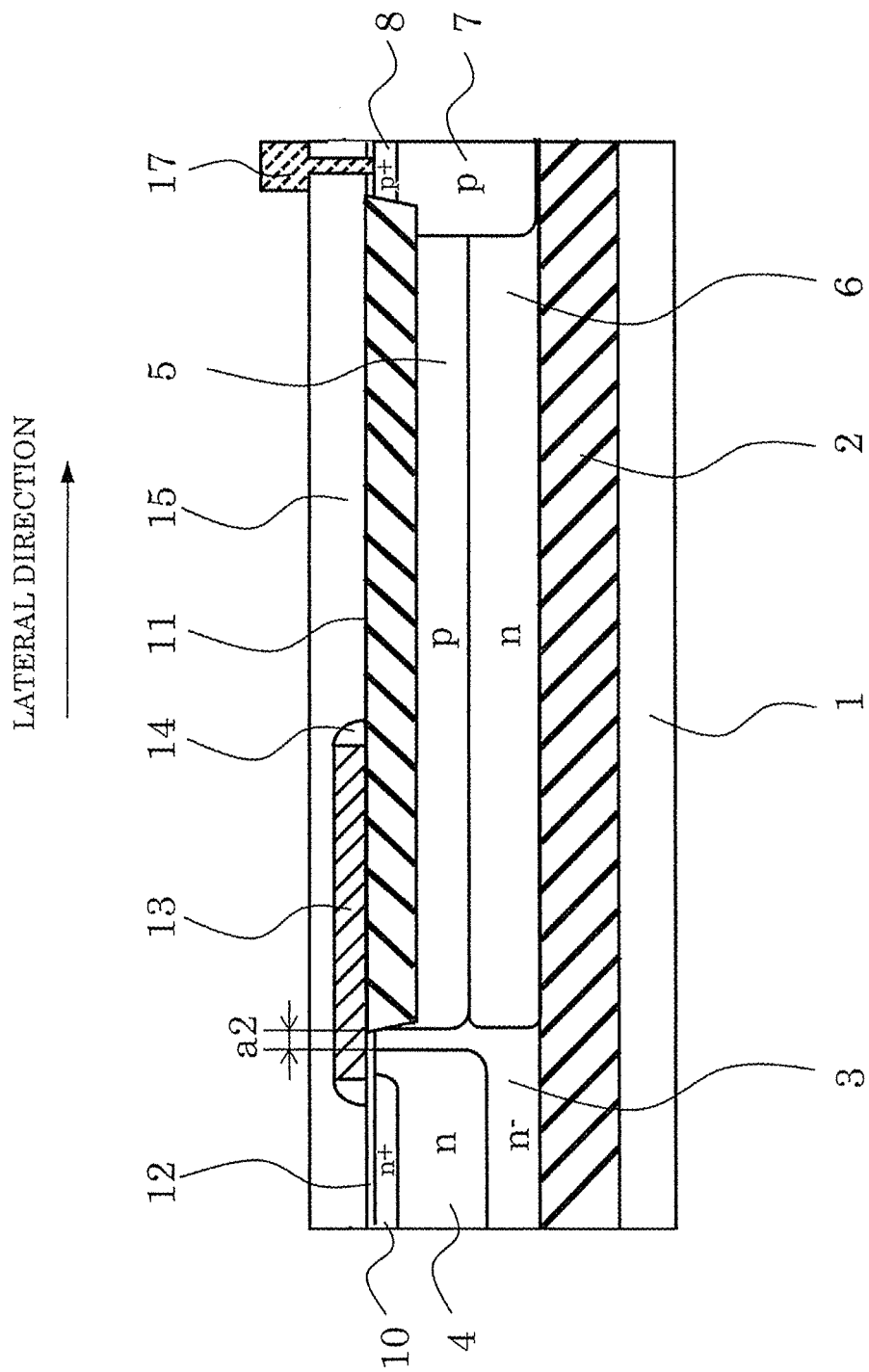
FIG. 2 is a schematic cross-sectional view of the semiconductor device according to Embodiment 1, taken along the line in (A) in FIG. 1.
Figure 3:
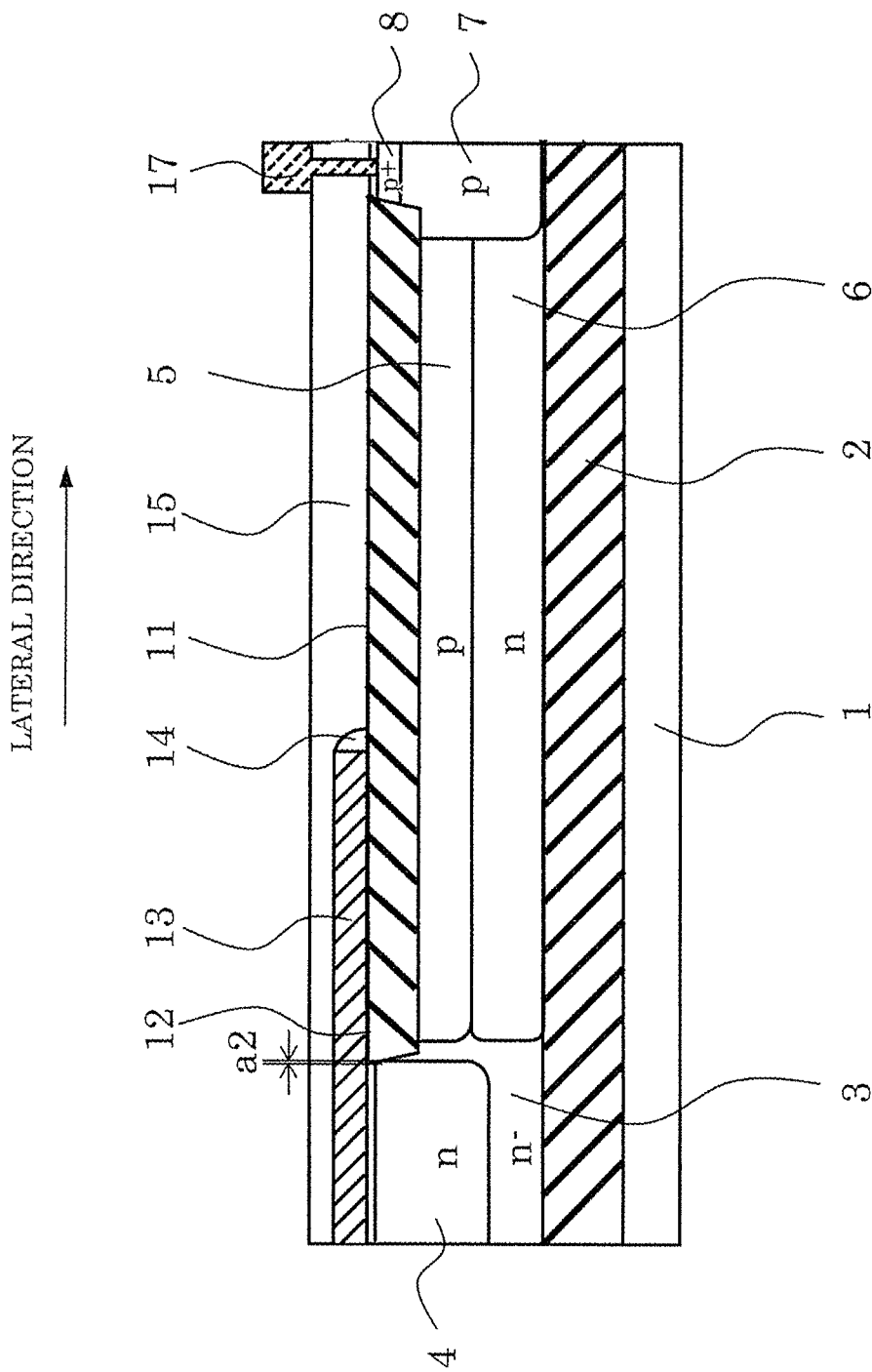
FIG. 3 is a schematic cross-sectional view of the semiconductor device according to Embodiment 1, taken along the line III-III' in (A) in FIG. 1.

FIG. 2 illustrates a cross-sectional view taken along the line II-II' in FIG. 1 while FIG. 3 illustrates a cross-sectional view taken along the line III-III' in FIG. 1. It should be noted that the cross-sectional view taken along the line I-I' in FIG. 1 is identical to that illustrated in FIG. 6 and is described as a comparative example.

As illustrated in FIGS. 1 through 3, n-type body region 4 that has a rectangular shape and is located at the center of the lateral P channel MOS transistor is surrounded by p-type drift region 5 and high-concentration p+ type drain region 8, both having a ring shape. Moreover, high-concentration p+ type source region 9 having a rectangular shape and high-concentration p+ type drain region 8 having a ring shape are both disposed to face each other in the straight portion along the longitudinal direction.

A space between n-type body region 4 and STI region 11 becomes narrower from the center to the end of n-type body region 4 in the longitudinal direction. The space corresponds to space a2 in the enlarged view illustrated in (B) in FIG. 1.

The line I-I' and the line correspond to a line in the lateral direction taken at the center portion with respect to the longitudinal direction and a line in the lateral direction taken at the end portion with respect to the longitudinal direction, respectively. FIG. 6 illustrates a cross-sectional view taken along the line I-I' and FIG. 2 illustrates a cross-sectional view taken along the line II-II'. Space a2 in the lateral direction, illustrated in FIG. 2, between n-type body region 4 and STI region 11 and located at the end portion in the longitudinal direction is narrower than space a2 at the center portion illustrated in FIG. 6. Furthermore, the space in the lateral direction between n-type body region 4 and STI region 11 becomes narrower from the center to the end of n-type body region 4 such that n-type body region 4 and STI region 11 come into contact at the end. The line III-III' in (A) in FIG. 1 corresponds to the line in the lateral direction located further toward the end portion in the longitudinal direction, and FIG. 3 illustrates a cross-sectional view taken along the line III-III'.

Space a2 in the lateral direction between n-type body region 4 and STI region 11 in the end portion of n-type body region 4, as illustrated in FIG. 3, is narrower than space a2 in FIG. 2 illustrating the cross-sectional view taken along the line II-II' in (A) in FIG. 1, and n-type body region 4 and STI region 11 are substantially in contact with each other. In FIG. 3, space a2 is shown to have a certain width in order to present space a2, but space a2 is substantially zero.

With such a structure, the following effects can be obtained.

When a reverse bias is applied between the drain and the source of the lateral P channel MOS transistor, a depletion layer, in a PN junction in a lateral direction, which is formed by n-type body region 4, low-concentration n-type semiconductor layer 3, and p-type drift region 5, expands. Since the impurity concentration of n-type body region 4 is higher than that of low-concentration n-type semiconductor layer 3 and that of p-type drift region 5, the expansion of the depletion layer to n-type body region 4 is relatively restrained and the depletion layer expands mainly to low-concentration n-type semiconductor layer 3 and p-type drift region 5.

As a result, space a2 illustrated in FIG. 2 becomes narrower than space a2 illustrated in FIG. 6 and a potential difference that occurs in the depletion layer gates smaller all the more as space a2 becomes narrower. This reduces the magnitude of electric field in STI region 11 edge below gate electrode 13.

What is more, space a2 illustrated in FIG. 3 is narrower than space a2 illustrated in FIG. 2 and becomes substantially zero. Therefore, a potential difference that occurs in the depletion layer gets smaller, and this reduces the magnitude of electric field.

As illustrated in (A) in FIG. 1, from the center to the end of n-type body region 4 in the longitudinal direction, space a2 in the lateral direction between STI region 11 and n-type body region 4 becomes narrower by width e of an uncovered region of STI region 11 becoming narrower while width f of n-type body region 4 having a rectangular shape (layout) remains unchanged.

By extending width f in the lateral direction of n-type body region 4, this layout has an advantage in reducing an area required in the vicinity of the end portion of n-type body region 4 in the longitudinal direction, as compared to the case of narrowing down space a2, in the lateral direction, between STI region 11 and n-type body region 4.

In the enlarged view illustrating the relevant part of the lateral P channel MOS transistor illustrated in (B) in FIG. 1 in a plan view, the edge line (the first edge line) indicating the inner periphery of STI region 11 connects points M, N, B, and P, and vertex angles at points N and B each are 135 degrees. The edge line (the second edge line) indicating the outer periphery of n-type body region 4 connects points C, E, F, and G, and vertex angles at points E and F each are 135 degrees. The edge line (the third edge line) indicating the inner periphery of p-type drift region 5 connects points H, J, K, and L, and vertex angles at points J and each are 135 degrees.

Each of the first edge line indicating the inner periphery of STI region 11, the second edge line indicating the outer periphery of n-type body region 4, and the third edge line indicating the inner periphery of p-type drift region 5 passes beneath gate electrode 13, and includes straight portions that face each other and extend along the longitudinal direction, and curved portions each connecting the ends of the straight portions either by a polygonal line forming an obtuse vertex angle or a curved line including an arc.

The second edge line indicating the outer periphery of n-type body region 4 forms a boundary between n-type body region 4 and semiconductor layer 3, at which impurity concentration changes from high to low, and has a relationship, in the plan view as described below, with the first edge line indicating the inner periphery of STI region 11.

On one hand, regarding the edge line connecting points M and N which is a straight portion in the longitudinal direction of the first edge line indicating the inner periphery of STI region 11, and the edge line connecting points C and E which is a straight portion in the longitudinal direction of the second edge line indicating the outer periphery of n-type body region 4, the second edge line indicating n-type body region 4 is located nearer, in the lateral direction, to p+ type source region 9 than the first edge line indicating STI region 11.

On the other hand, between the edge line connecting points N, B, and P which is a curved portion of the first edge line indicating the inner periphery of STI region 11, and the edge line connecting points E, F, and G which is a curved portion of the second edge line indicating the outer periphery of n-type body region 4, the first edge line indicating STI region 11 includes a portion located nearer, in the longitudinal direction, to p+ type source region 9 than the second edge line indicating n-type body region 4.

Accordingly, the line connecting points N and B of the first edge line indicating the inner periphery of STI region 11 intersects, at point D, with the line connecting points C and E of the second edge line indicating the outer periphery of n-type body region 4. An angle made by the first edge line and the second edge line is 45 degrees to form an acute angle. The first edge line and the second edge line forming a space that becomes narrower in the longitudinal direction.

With the second edge line indicating n-type body region 4 and the first edge line indicating STI region 11 having such a crossover structure, in the relationship between n-type body region 4 and STI region 11, a curved line, which connects the points where the equipotential lines are closely-spaced and the electric field intensifies in (B) in FIG. 1, extends along a line that connects points M, N, and D of the inner edge line indicating STI region 11 and a line that connects points D, E, and F of the outer edge line indicating n-type body region 4. Accordingly, in the relationship between n-type body region 4 and STI region 11, when the angle that is made at point D of the line connecting points N, D, and E, and that is formed by n-type body region 4 and STI region 11 gets smaller, the curvature of equipotential lines here increases and electric field strength also increases, which is not favorable. Since this angle at point D is 135 degrees in this embodiment, the curvature of equipotential lines here decreases and the electric field does not intensify. This is the same as making the angle made by the first and second edge lines toward point D in the longitudinal direction to be 45 degrees to form an acute angle.

The third edge line indicating the inner periphery of p-type drift region 5 forms a boundary between p-type drift region 5 and semiconductor layer 3 that have conductivity types different from each other, and has a relationship with the first edge line indicating the inner periphery of STI region 11, as indicated below.

On one hand, between the edge line connecting points M and N which is a straight portion in the longitudinal direction of the first edge line indicating the inner periphery of STI region 11, and the edge line connecting points H and J which is a straight portion in the longitudinal direction of the third edge line indicating the inner periphery of p-type drift region 5, the third edge line indicating p-type drift region 5 is located nearer, in the lateral direction, to $p^+$ type source region 9 than the first edge line indicating STI region 11.

On the other hand, between the edge line connecting points N, B, and P which is a curved portion of the first edge line indicating the inner periphery of STI region 11, and the edge line connecting points J, K, and L which is a curved portion of the third edge line indicating the inner periphery of p-type drift region 5, the first edge line indicating STI region 11 includes a portion located nearer, in the longitudinal direction, to $p^+$ type source region 9 than the third edge line indicating p-type drift region 5.

The line connecting points N and B of the first edge line indicating the inner periphery of STI region 11 intersects, at point A, with the line connecting points H and J of the third edge line indicating the inner periphery of p-type drift region 5. An angle made by the first edge line and the third edge line, between which a space becomes narrower toward point A along the longitudinal direction, is 45 degrees to form an acute angle.

With the third edge line indicating p-type drift region 5 and the first edge line indicating STI region 11 having such a crossover structure, in the relationship between p-type drift region 5 and STI region 11, a curved line which connects the points where the equipotential lines are closely-spaced and the electric field intensifies in (B) in FIG. 1, extends along a line that connects points M, N, and A of the inner edge line indicating STI region 11 and a line that connects points A, J, K, and L of the inner edge line indicating p-type drift region 5.

Accordingly, in the relationship between p-type drift region 5 and STI region 11, when the angle, which is made at point A of the line connecting points N, A, and J and is formed by p-type drift region 5 and STI region 11, gets smaller, the curvature of equipotential lines here increases and electric field strength also increases, which is not favorable. As has previously been described, since the angle at point A is 135 degrees in this embodiment, the curvature of equipotential lines here decreases and the electric field does not intensify. This is the same as making the angle made by the first and third edge lines toward point A in the longitudinal direction to be 45 degrees to form an acute angle.

It is desirable to set the angle made, toward an intersection along the longitudinal direction, by the first edge line indicating the inner periphery of STI region 11 and the second edge line indicating the outer periphery of n-type body region 4 or the third edge line indicating the inner periphery of p-type drift region 5, to be in the range from 30 degrees to 60 degrees, inclusive. Since an area required in the end portion in the longitudinal direction of the lateral P-channel MOS transistor increases as this angle gets smaller, it is desirable to set the angle to be 45 degrees as is set in this embodiment.

Next, in (B) in FIG. 1, regarding a space of a region in which gate electrode 13 overlaps with n-type body region 4, space b1 in the longitudinal direction at the curved portions of the second edge line indicating n-type body region 4 is set wider than space b2 in the lateral direction at the straight portions of the second edge line indicating the body region. In the comparative example illustrated in FIG. 7, however, space b1 and space b2 are designed to have the same size.

Since the region in which gate electrode 13 overlaps with n-type body region 4 forms a portion of a channel region in the lateral P-channel MOS transistor, when space b2 between gate electrode 13 and n-type body region 4 becomes wider at the straight portion of the second edge line indicating n-type body region 4 in (B) in FIG. 1, channel resistance increases and current capability decreases. Even when space b1 at a curved portion of n-type body region 4 in (B) in FIG. 1 is widened, transistor operation is not affected because contribution as current capability is less at the curved portions of the second edge line indicating n-type body region 4. In view of the above, space b1 between gate electrode 13 and n-type body region 4 in the longitudinal direction is set wider than space b2 in the lateral direction. This simplifies the layout design of the end portions in the longitudinal direction of the lateral P channel MOS transistor.

Next, in (B) in FIG. 1, regarding a space, on gate insulating film 12, from gate electrode 13 edge to STI region 11 edge, space c1 in the longitudinal direction at the curved portions of the first edge line indicating STI region 11 is set narrower than space c2 in the lateral direction at the straight portions of the first edge line indicating STI region 11. In the comparative example illustrated in FIG. 7, however, space c1 and space c2 are designed to have the same size. The space on gate insulating film 12 between gate electrode 13 and STI region 11 edge is a region that forms an entrance to the channel region and p-type drift region 5, and therefore, it is not possible to shorten, in the lateral direction more than necessary, the space which forms the main portion of the channel region.

When space c2 between gate electrode 13 and STI region 11 in the lateral direction is shortened more than necessary at the straight portion of the first edge line indicating STI region 11, reduction in a threshold voltage (Vt) is caused by short channel effect, and what is more, the entrance to p-type drift region 5 is made narrower. As a result, current capability is lowered due to on-resistance increase. Since a drain current hardly flows in the longitudinal direction at the curved portions, narrowing the space on gate insulating film 12 between gate electrode 13 and the edge of STI region 11 does not affect transistor operation. In view of this, space c1, in the longitudinal direction, on gate insulating film 12 between gate electrode 13 and STI region 11 edge is set to be narrower than space c2 in the lateral direction. This simplifies the layout design of the end portions in the longitudinal direction of the lateral P channel MOS transistor.

Next, a size relationship among width f in the lateral direction at the straight portion of the second edge line indicating the outer periphery of n-type body region 4, width g in the lateral direction of the third edge line indicating the inner periphery of p-type drift region 5, and width e in the lateral direction of the first edge line indicating the inner periphery of STI region 11 is defined as f<g<e, as illustrated in (A) in FIG. 1.

In (B) in FIG. 1, point N which is an end point of one of the straight portions of STI region 11 is disposed at a position nearer to p$^+$ type source region 9 than point E which is an end point of one of the straight portions of n-type body region 4. In fact, point N is located in a position where point N overlaps with p$^+$ type source region 9 in the longitudinal direction and point E is located lower than the lower end of p$^+$ type source region 9. Here, length i between point E and point N in the longitudinal direction is set to be longer by half the size difference between two widths: width e between the straight portions of the first edge line indicating STI region 11; and width f between the straight portions of the second edge line indicating n-type body region 4, that is, space a2 in the lateral direction.

This also applies to p-type drift region 5 in (B) in FIG. 1 and point N which is an end of one of the straight portions in the longitudinal direction of STI region 11 is disposed at a position nearer to p$^+$-type source region 9 in the longitudinal direction than point J which is an end of one of the straight portions in the longitudinal direction of p-type drift region 5. In fact, point N is located in a position where point N overlaps with p$^+$ type source region 9 in the longitudinal direction and point J is located lower than the lower end of p$^+$ type source region 9. Here, length j between point J and point N in the longitudinal direction is set to be longer by half the difference between width e in the lateral direction at the straight portion of the first edge line indicating STI region 11 and width g in the lateral direction at the straight portion of the third edge line indicating n-type drift region 5, that is, space n2 in the lateral direction.

With such a layout, it is possible to easily form an acute angle made by the edge lines of the regions at point D which is an intersection of n-type body region 4 and STI region 11 and at point A which is an intersection of p-type drift region 5 and STI region 11.

Next, regarding a space between the second edge line indicating the outer periphery of n-type body region 4 and the first edge line indicating the inner periphery of STI region 11, space a1 in the longitudinal direction at the curved portions of n-type body region 4 is set to be narrower than space a2 in the lateral direction at the straight portions of n-type body region 4, as illustrated in (B) in FIG. 1. Since the lateral direction is a direction in which current flows when the transistor operates, current capability is degraded if the space in the lateral direction is made narrower. In contrast, since contribution to the current capability is small in the longitudinal direction, narrowing the space in the longitudinal direction causes no problem unless breakdown voltage is affected. With such a configuration, it is possible to reduce electrical field strength in the end portions in the longitudinal direction of the lateral P channel MOS transistor, and also, to suppress area increase at the end portions.

Next, regarding the span of gate electrode 13 having a ring shape, span d1 in the longitudinal direction is set to be narrower than span d2 in the lateral direction, as illustrated in (A) in FIG. 1. Gate electrode 13 also serves as a field plate and it is possible to reduce electric field strength because widening the width on STI region 11 is more effective in expanding the depletion layer in a lateral direction. Although the portion in which electric field concentrates is t the edge of the STI region that is in contact with the gate insulating film in the comparative example, the thickness of an oxide film becomes thicker because STI region 11 is disposed very near to n-type body region 4 edge in this embodiment. Since this improves the breakdown voltage of gate electrode 13 as a field plate, it is all the more possible, from the viewpoint as a field plate, to narrow the width of the gate electrode in the longitudinal direction than the width of the gate electrode in the lateral direction. As a result, it is possible to suppress area increase at the end portions in the longitudinal direction.

Next, regarding the space of a region, which does not cover n-type body region 4, of gate electrode 13, space h1 in the longitudinal direction at the curved portions of the second edge line indicating n-type body region 4 is set to be narrower than space h2 in the lateral direction at the straight portions of the second edge line indicating n-type body region 4, as illustrated in (A) in FIG. 1. This structure produces the same effects for the same reasons as has been described above for the setting of the widths of gate electrode 13 in the longitudinal and lateral directions.

It should be noted that although n-type body region 4 is surrounded by STI region 11 and p-type drift region 5 in the layout of the lateral P channel transistor according to this embodiment, the layout is not limited to such, and STI region 11 and p-type drift region 5 may be surrounded by n-type body region 4, on the contrary.

Figure 4:
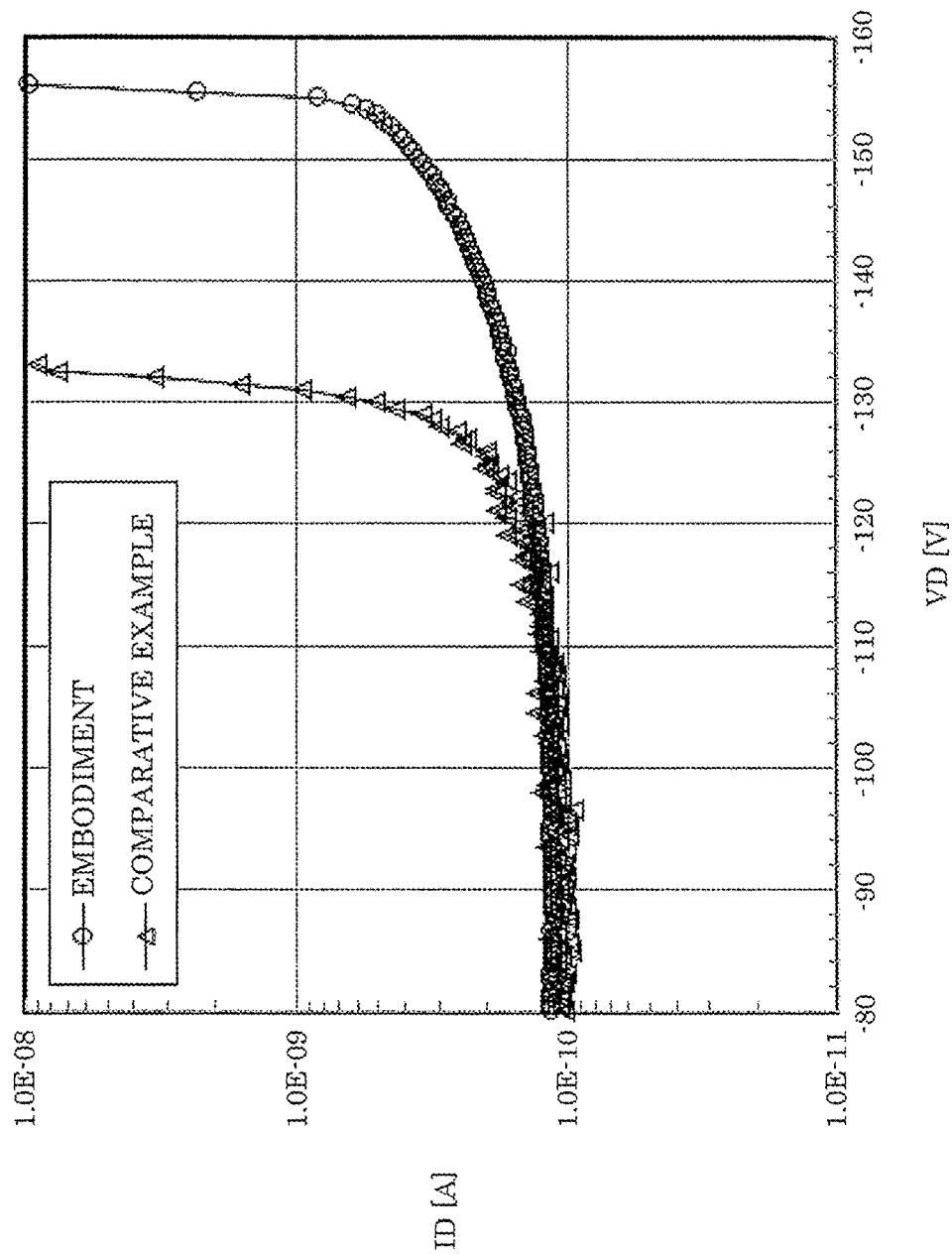
FIG. 4 is a current-voltage characteristic diagram illustrating a result of comparing between a drain-source breakdown voltage of a lateral P channel MOS transistor according to Embodiment 1 and a drain-source breakdown voltage of a lateral P channel MOS transistor illustrated as a comparative example.

FIG. 4 shows the result of comparing current-voltage characteristics of drain-source breakdown voltage between the lateral P channel MOS transistor having the layout structure according to this embodiment and the lateral P channel MOS transistor illustrated as the comparative example. As is apparent from the current-voltage characteristics shown in FIG. 4, the breakdown voltage achieved with the structure according to this embodiment is 150 V, and it was possible to greatly improve the breakdown voltage by approximately 20 V compared to 130 V which is the breakdown voltage achieved with the structure illustrated in the comparative example.

Note that each of the layout structures described in this embodiment solely produces advantageous effects, but more advantageous effects can be obtained by a structure realized by combining the layout structures where necessary.

Embodiment 2

In the layout of the lateral P channel MOS transistor according to Embodiment 1, each of four corners of each of the first edge line indicating the inner periphery of STI region 11, the second edge line indicating the outer periphery of n-type body region 4, and the third edge line indicating the inner periphery of p-type drift region 5 is made by straight lines forming a vertex angle of 135 degrees in a plan view. Each of the corners, however, shall not be limited to the formation by straight lines and may be formed using a curved line to have an arc like shape. (A) and (B) in FIG. 5 each show a plan view when each of the corners has an arc-like shape.

The parts forming an arc are: a part between point E and point F of the outer edge line indicating n-type body region 4 having a substantially rectangular shape; a part between point J and point K of the inner edge line indicating p-type drift region 5; and a part between point N and point B of the inner edge line indicating STI region 11.

A part from point C to point E of the outer edge line indicating n-type body region 4 intersects at point D with a part from point N to point B of the inner edge line indicating STI region.

A part from point H to point J of the inner edge line indicating p-type drift region 5 intersect at point A with the part from point N to point B indicating the inner edge line of STI region 11.

With such a layout structure, the advantageous effects obtained with Embodiment 1 can be obtained, and also, by making each of the curved portions to have an arc-like shape, the curvature of equipotential lines when a transistor is in operation is improved more than with Embodiment 1.

Although all of the curved portions of each of the edge lines have an arc-like shape in this embodiment, a part of the curved portions may be formed by a polygonal line using straight lines to make an obtuse vertex angle.

It should be noted that the same advantageous effects as obtained by each of the layout structures described in Embodiment 1 as well as the advantageous effects obtained by combinations of the layout structures are obtainable also with this embodiment.

A lateral P channel MOS transistor is used as one example in Embodiments 1 and 2, but the embodiments of the present disclosure shall not be limited to this. With the replacement of a conductivity type of each of the elements with an opposite type, the same advantageous effects are still obtainable by using a lateral N channel MOS transistor as one example.

Although the semiconductor device has been described based on Embodiments 1 and 2, the present disclosure shall not be restricted to Embodiments 1 and 2. Embodiments arrived at by a person skilled in the art making various modifications to any one of Embodiments 1 and 2 as well as embodiments realized by arbitrarily combining structural components and functions in Embodiments 1 and 2 which do not depart from the essence of the present disclosure are included in the present disclosure.

INDUSTRIAL APPLICABILITY

The present disclosure improves the breakdown voltage of a MOS transistor having high breakdown voltage as well as suppresses area increase at the end portions of a device, and is particularly useful for a MOS transistor having high breakdown voltage to be mounted on a device having a target breakdown voltage of 100 V or higher, such as an in-vehicle device.

What is claimed is:
1. A semiconductor device, comprising:
a semiconductor layer above a main face of a semiconductor substrate, with a buried insulating layer disposed between the semiconductor substrate and the semiconductor layer; a body region of a first conductivity type in an upper portion of the semiconductor layer;
a drain region of a second conductivity type in the upper portion of the semiconductor layer and spaced apart from the body region;
a source region of the second conductivity type in a surface of the body region;
a drift region of the second conductivity type between the drain region and the body region in the semiconductor layer;
an insulating region between the body region and the drain region in a surface of the semiconductor layer, the insulating region overlapping with the drift region;
a gate insulating film extending over a portion of the body region up to an edge of the insulating region in a surface of the semiconductor layer;
a gate electrode extending over a portion of the gate insulating film and a portion of the insulating region; and
an electrode on the source region and an electrode on the drain region, wherein
in a plan view:
the source region and the drain region extend along a longitudinal direction and are disposed side-by-side in a lateral direction, the longitudinal direction being a direction along a longer side of sides facing each other, the lateral direction being a direction perpendicular to the longitudinal direction; and
the body region extends along the longitudinal direction and is surrounded by the drift region and the insulating region,
a space in the lateral direction between the insulating region and the body region becomes narrower from a center to an end of the body region in the longitudinal direction.

2. The semiconductor device according to claim 1, wherein
in the plan view, the space in the lateral direction between the insulating region and the body region becomes narrower from the center to the end of the body region in the longitudinal direction such that the insulating region and the body region come into contact at the end.

3. The semiconductor device according to claim 1, wherein
in the plan view, from the center to the end of the body region in the longitudinal direction, the space in the lateral direction between the insulating region and the body region becomes narrower by a width becoming narrower, the width being a width of an uncovered region of the insulating region.

4. The semiconductor device according to claim 1, wherein
in the plan view, a span of the gate electrode having a ring shape is narrower in the longitudinal direction than in the lateral direction.

5. The semiconductor device according to claim 1, wherein
in the plan view, a space of a region, which uncovers the body region, of the gate electrode is narrower in the longitudinal direction at the curved portions of the second edge line indicating the body region than in the lateral direction at the straight portions of the second edge line indicating the body region.

6. A semiconductor device, comprising:
a semiconductor layer above a main face of a semiconductor substrate, with a buried insulating layer disposed between the semiconductor substrate and the semiconductor layer;
a body region of a first conductivity type in an upper portion of the semiconductor layer;
a drain region of a second conductivity type in the upper portion of the semiconductor layer and spaced apart from the body region;
a source region of the second conductivity type in a surface of the body region;

a drift region of the second conductivity type between the drain region and the body region in the semiconductor layer;

an insulating region between the body region and the drain region in a surface of the semiconductor layer;

a gate insulating film extending over a portion of the body region up to an edge of the insulating region in a surface of the semiconductor layer;

a gate electrode extending over a portion of the gate insulating film and a portion of the insulating region; and an electrode on the source region and an electrode on the drain region, wherein in a plan view:

the source region and the drain region extend along a longitudinal direction and are disposed side-by-side in a lateral direction, the longitudinal direction being a direction along a longer side of sides facing each other, the lateral direction being a direction perpendicular to the longitudinal direction; and the body region and the insulating region extend along the longitudinal direction and are disposed such that one of the body region and the insulating region surrounds the other of the body region and the insulating region in a layout, the layout including a first edge line which indicates an edge of the insulating region and a second edge line which indicates an edge of the body region, the first edge line and the second edge line passing beneath the gate electrode, the second edge line forms a boundary between the body region and the semiconductor layer which have impurity concentrations or conductivity types different from each other, and in the plan view:

the first edge line and the second edge line each have: straight portions that face each other and extend along the longitudinal direction; and curved portions each connecting ends of the straight portions either by a polygonal line forming an obtuse vertex angle or a curved line including an arc;

in the straight portions, the second edge line indicating the body region includes a portion located nearer, in the lateral direction, to the source region than the first edge line indicating the insulating region;

in the curved portions, the first edge line indicating the insulating region includes a portion located nearer, in the longitudinal direction, to the source region than the second edge line indicating the body region;

the first edge line intersects with the second edge line at an intersection; and at the intersection, an angle made by the first edge line and the second edge line is acute, the first edge line and the second edge line forming a space that becomes narrower in the longitudinal direction.

7. The semiconductor device according to claim 6, wherein in the plan view, the angle that is acute at the intersection is in a range from 30 degrees to 60 degrees, inclusive.

8. The semiconductor device according to claim 6, wherein in the plan view, in a region in which the body region overlaps with the gate electrode, a space in the longitudinal direction at the curved portions of the second edge line indicating the body region is wider than a space in the lateral direction at the straight portions of the second edge line indicating the body region.

9. The semiconductor device according to claim 6, wherein in the plan view, a space, on the gate insulating film, from an edge of the gate electrode to an edge of the insulating region is narrower in the longitudinal direction at the curved portions of the first edge line indicating the insulating region than in the lateral direction at the straight portions of the first edge line indicating the insulating region.

10. The semiconductor device according to claim 6, wherein in the plan view, a first end point of a straight portion out of the straight portions of an edge line indicating an edge of the one of the body region and the insulating region is located nearer, in the longitudinal direction, to the source region than a second end point of a straight portion out of the straight portions of an edge line indicating an edge of the other of the body region and the insulating region, the first end point and the second end point being located on a same side of the respective straight portions extending on a same side.

11. The semiconductor device according to claim 10, wherein in the plan view, the first end point is located nearer, in the longitudinal direction, to the source region than the second end point by at least half a size difference between two widths: a width between the straight portions of the edge line indicating the edge of one of the body region and the insulating region; and a width between the straight portions of the edge line indicating the edge of the other of the body region and the insulating region.

12. The semiconductor device according to claim 6, wherein in the plan view, a space between the first edge line indicating the insulating region and the second edge line indicating the body region or the third edge line indicating the drift region is narrower in the longitudinal direction at the curved portions than in the lateral direction at the straight portions.

13. A semiconductor device, comprising:

a semiconductor layer of a first conductivity type above a main face of a semiconductor substrate, with a buried insulating layer disposed between the semiconductor substrate and the semiconductor layer;

a body region of the first conductivity type in an upper portion of the semiconductor layer;

a drain region of a second conductivity type in the upper portion of the semiconductor layer and spaced apart from the body region;

a source region of the second conductivity type in a surface of the body region;

a drift region of the second conductivity type between the drain region and the body region in the semiconductor layer;

an insulating region between the body region and the drain region in a surface of the semiconductor layer;

a gate insulating film extending over a portion of the body region up to an edge of the insulating region in a surface of the semiconductor layer;

a gate electrode extending over a portion of the gate insulating film and a portion of the insulating region; and an electrode on the source region and an electrode on the drain region, wherein in a plan view:

the source region and the drain region extend along a longitudinal direction and are disposed side-by-side in a lateral direction, the longitudinal direction being a direction along a longer side of sides facing each other, the lateral direction being a direction perpendicular to the longitudinal direction; and the drift region and the insulating region extend along the longitudinal direction and are disposed such that one of the drift region and the insulating region surrounds the other of the drift region and the insulating region in a layout, the layout including a first edge line indicating an edge of the insulating region and a third edge line indicating an edge of the drift region, the first edge line and the third edge line passing beneath the gate electrode, the third edge line forms a boundary between the drift region and the semiconductor layer which have conductivity types different from each other, and in the plan view:

the first edge line and the third edge line each have: straight portions that face each other and extend along the longitudinal direction; and curved portions each connecting ends of the straight portions either by a polygonal line forming an obtuse vertex angle or a curved line including an arc;

in the straight portions, the third edge line indicating the drift region includes a portion located nearer, in the lateral direction, to the source region than the first edge line indicating the insulating region;

in the curved portions, the first edge line indicating the insulating region includes a portion located nearer, in the longitudinal direction, to the source region than the third edge line indicating the drift region;

the first edge line intersects with the third edge line at an intersection; and at the intersection, an angle made by the first edge line and the third edge line is acute, the first edge line and the third edge line forming a space that becomes narrower in the longitudinal direction.

* * * * *